(12) United States Patent
Kaneko

(10) Patent No.: US 9,029,261 B2
(45) Date of Patent: May 12, 2015

(54) SEMICONDUCTOR DEVICE FABRICATION METHOD AND SEMICONDUCTOR DEVICE

(71) Applicant: Lapis Semiconductor Co., Ltd., Kanagawa (JP)

(72) Inventor: Yuichi Kaneko, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 14/227,333

(22) Filed: Mar. 27, 2014

(65) Prior Publication Data

US 2014/0306321 A1    Oct. 16, 2014

(30) Foreign Application Priority Data

Apr. 15, 2013 (JP) ................. 2013-085098

(51) Int. Cl.
| | |
|---|---|
| H01L 21/302 | (2006.01) |
| H01L 21/311 | (2006.01) |
| H01L 21/31 | (2006.01) |
| H01L 31/113 | (2006.01) |
| H01L 23/02 | (2006.01) |
| H01L 23/544 | (2006.01) |
| H01L 21/304 | (2006.01) |
| H01L 21/78 | (2006.01) |
| H01L 23/58 | (2006.01) |
| H01L 23/00 | (2006.01) |

(52) U.S. Cl.
CPC ............ *H01L 23/544* (2013.01); *H01L 21/304* (2013.01); *H01L 21/78* (2013.01); *H01L 2924/10158* (2013.01); *H01L 23/585* (2013.01); *H01L 24/03* (2013.01); *H01L 2224/0345* (2013.01); *H01L 2224/94* (2013.01); *H01L 2924/13055* (2013.01); *H01L 2924/13091* (2013.01)

(58) Field of Classification Search
CPC .................. H01L 2924/3512; H01L 2224/94; H01L 2221/68327; H01L 27/1266; H01L 2221/68363; H01L 21/76256; H01L 24/94; H01L 31/18
USPC ......... 438/690, 694, 697, 707, 716, 759, 771; 257/341, 342, 678
See application file for complete search history.

(56) References Cited

U.S. PATENT DOCUMENTS 5,994,187 A * 11/1999 Okabe et al. .................. 438/268
6,261,919 B1 * 7/2001 Omizo .......................... 438/401

FOREIGN PATENT DOCUMENTS

JP    H03-0236225 A    10/1991

* cited by examiner

*Primary Examiner* — Hsien Ming Lee
(74) *Attorney, Agent, or Firm* — Volentine & Whitt, PLLC

(57) ABSTRACT

There is provided a method of fabricating a semiconductor device, the method including: forming a semiconductor component portion at a first surface of a substrate; applying a grinding treatment to a second surface of the substrate that is opposite from the first surface to form a fracture surface; applying a fracture surface removal treatment to predetermined positions of the fracture surface of the second surface; and forming an electrode at the second surface.

6 Claims, 12 Drawing Sheets

SEMICONDUCTOR DEVICE FABRICATION METHOD AND SEMICONDUCTOR DEVICE

CROSS-REFERENCE TO RELATED APPLICATION

This application is based on and claims priority under 35 USC 119 from Japanese Patent Application No. 2013-085098 filed on Apr. 15, 2013, the disclosure of which is incorporated by reference herein.

BACKGROUND

1. Technical Field

The present invention relates to a semiconductor device fabrication method and to a semiconductor device.

2. Related Art

Technologies for semiconductor device fabrication methods that improve on-resistances and the like are commonly known. For example, Japanese Patent Application Laid-Open (JP-A) No. H3-236225 recites a technology that improves on-resistance by reducing the thickness of a substrate (a wafer), by the application of background grinding to grind a rear surface (the surface of a side at which device layers are not formed) of the substrate, and increases a contact area between the rear surface of the wafer and a back metal (an electrode formed at the rear surface).

However, when back-grinding is applied as in the technology recited in JP-A No. H3-236225, the transverse strength of the wafer is reduced by microcracks that form in a fracture surface and the like, and there is concern that chip cracks may form and cause breakages.

SUMMARY

The present invention is proposed to solve the problem described above, and an object of the present invention is to provide a semiconductor device fabrication method and semiconductor device that may both reduce on-resistance and achieve an improvement in transverse strength.

An aspect of the present invention provides a method of fabricating a semiconductor device, the method including:

forming a semiconductor component portion at a first surface of a substrate;

applying a grinding treatment to a second surface of the substrate that is opposite from the first surface to form a fracture surface;

applying a fracture surface removal treatment to predetermined positions of the fracture surface of the second surface; and forming an electrode at the second surface.

Another aspect of the present invention provides a semiconductor device including:

a substrate having a first surface and a second surface, the second surface being opposite from the first surface and having a fracture surface formed by a grinding treatment, predetermined positions of the fracture surface having been subjected to a grinding surface removal treatment;

a semiconductor component portion formed at the first surface; and an electrode formed at the second surface.

According to the present invention, effects are provided in that on-resistance may be reduced and an improvement in transverse strength may be realized.

BRIEF DESCRIPTION OF THE DRAWINGS

An exemplary embodiment of the present invention will be described in detail based on the following figures, wherein.

DETAILED DESCRIPTION

Herebelow, exemplary embodiments of the present invention are described in detail, referring to the attached drawings.

Figure 1:
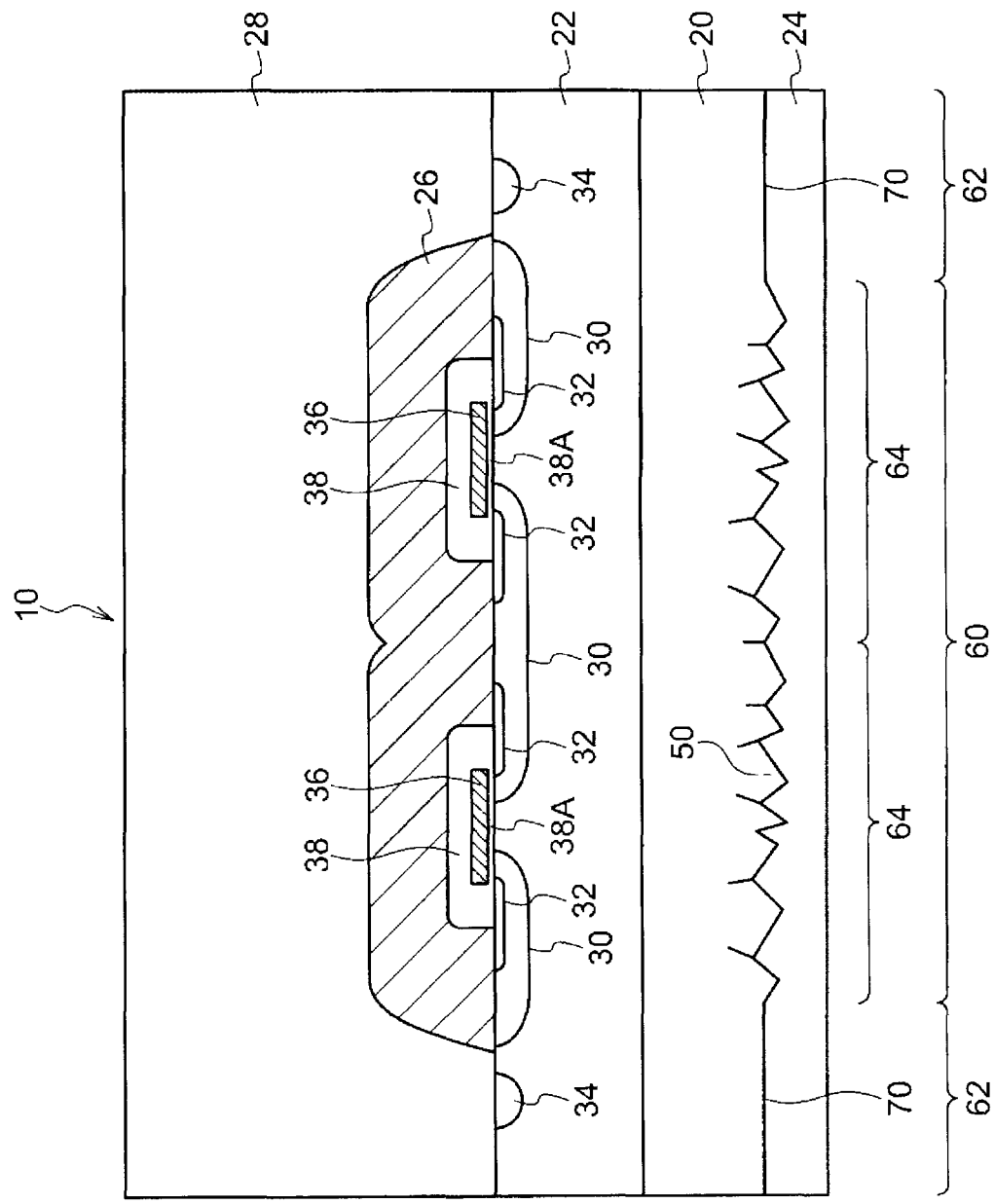
FIG. 1 is a sectional diagram showing the general structure of an example of a semiconductor device in accordance with a present exemplary embodiment.

First, a semiconductor device that is formed by a method in accordance with the present exemplary embodiment is described. FIG. 1 is a sectional diagram showing the general structure of an example of the semiconductor device formed in accordance with the present exemplary embodiment. As a concrete example in the present exemplary embodiment, a semiconductor device equipped with semiconductor components that are vertical MOSFETs is described.

An $N^+$ semiconductor substrate 20 is an $N^+$ type substrate. As a concrete example, an $N^+$-type silicon substrate doped with arsenic (As) or phosphorus (P) can be mentioned.

An $N^-$ epitaxial layer 22 is formed on the $N^+$ semiconductor substrate 20. As a concrete example of the $N^-$ epitaxial layer 22, an epitaxial layer of $N^-$-type silicon doped with arsenic or phosphorus can be mentioned.

A P layer 30, which is a $P^+$-type contact region, and an $N^+$ layer 32, which is an $N^+$-type source region, are formed on the surface of component regions 60 of the N⁻ epitaxial layer 22. An interlayer insulation film 38 and polysilicon (N⁺ polycrystalline silicon) 36, which is to function as gate electrodes, are also formed on the N⁻ epitaxial layer 22. A surface electrode metal 26, which is to function as source electrodes, is also formed on the N⁻ epitaxial layer 22, so as to cover the whole of the component regions 60.

Guard rings 34 are formed in the surface of the N⁻ epitaxial layer 22 so as to enclose the component regions 60 (to be described in detail below). Regions outside the component regions 60, in which the guard rings 34 are formed, are a guard ring region 62.

A protective film 28 is formed on the N⁻ epitaxial layer 22 so as to cover all of the surface in which vertical MOSFETs 64 and the guard rings 34 are formed.

Hereinafter, the surface electrode metal 26, the P layer 30, the N⁺ layer 32, the polysilicon 36 and the interlayer insulation film 38 are collectively referred to as semiconductor components.

A fracture surface 50 that has been fractured by a back-grinding treatment is provided at a region of the rear surface of the N⁺ semiconductor substrate 20 (the surface at which the semiconductor components are not formed) that corresponds with the component regions 60. A laser annealing region 70 that is laser-annealed is provided at a region of the rear surface of the N⁺ semiconductor substrate 20 that corresponds with the guard ring region 62.

A back metal electrode 24, which is to function as drain electrodes, is formed over the whole of the rear surface of the N⁺ semiconductor substrate 20.

Now, a method of fabrication of a semiconductor device 10 in accordance with the present invention is described. Herebelow, for simplicity of description, the surface of the wafer at which the semiconductor components are formed is referred to as "the front surface" and the surface at which the semiconductor components are not formed is referred to as "the rear surface".

Figure 2:
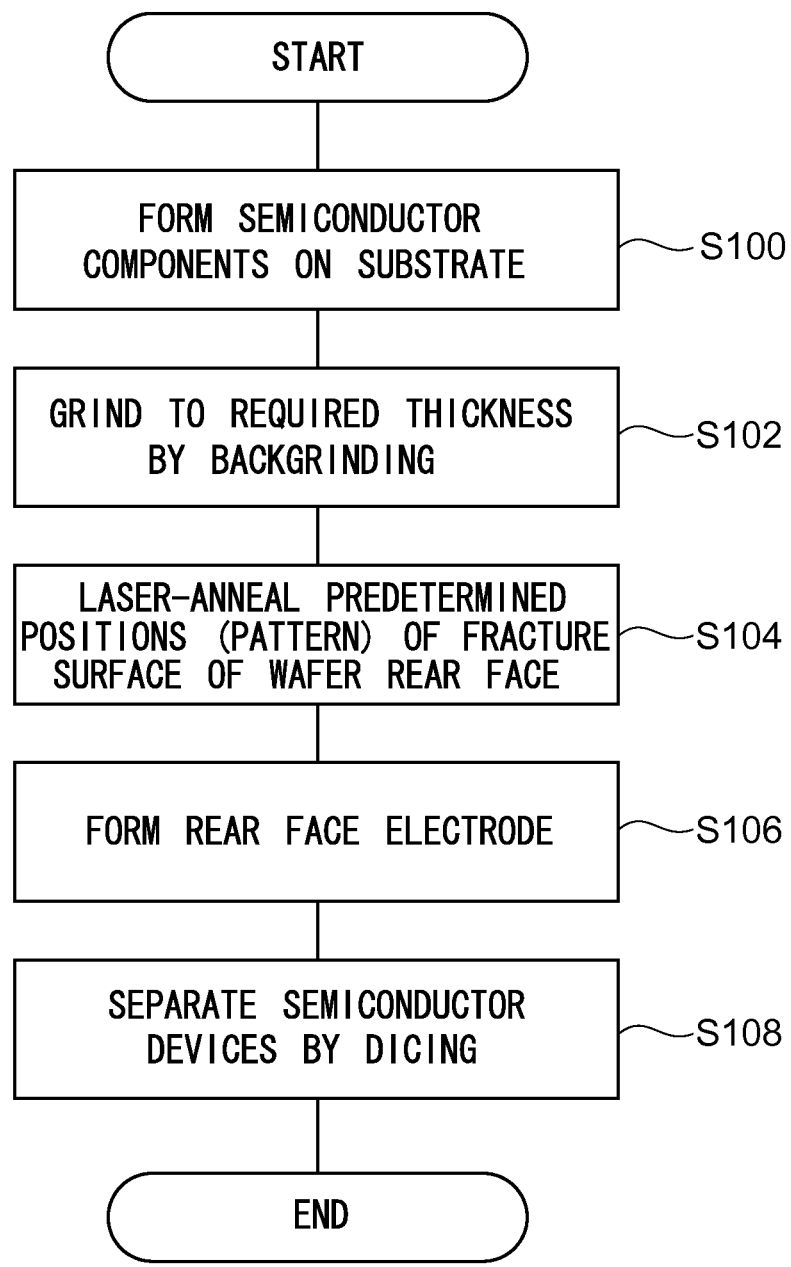
FIG. 2 is a flowchart illustrating the flow of an example of a semiconductor device fabrication method in accordance with the present exemplary embodiment.

FIG. 2 is a flowchart illustrating the flow of an example of the method of fabrication of the semiconductor device 10 according to the present exemplary embodiment. The overall flow of the method of fabricating the semiconductor device 10 is described with reference to FIG. 2.

As shown in FIG. 2, in step S100, which is a first step, the semiconductor components are formed on the wafer 100 that is formed of the N⁺ semiconductor substrate 20 and the N⁻ epitaxial layer 22. The guard rings 34 and the protective film 28 are also formed in this step. In step S102, which is a second step, the rear surface of the wafer 100 (the N⁺ semiconductor substrate 20) is ground to a predetermined thickness by back-grinding and the fracture surface 50 is formed. In step S104, which is a third step, laser annealing is applied to predetermined positions (a pattern) of the fracture surface 50 of the wafer 100 (the N⁺ semiconductor substrate 20). In the region that is laser-annealed by this treatment, the fracture surface 50 is melted and smoothed. In step S106, which is a fourth step, the back metal electrode 24 is formed on the rear surface of the wafer 100 (the N⁺ semiconductor substrate 20). In step S108, which is a fifth step, the wafer is diced and the semiconductor device 10 is singulated. Thus, the semiconductor device 10 according to the present exemplary embodiment is fabricated by the procedure of steps S100 to S108.

These steps are now described in detail. In practice, a number of the semiconductor devices 10 would be formed on the wafer 100 (the N⁺ semiconductor substrate 20 and the N⁻ epitaxial layer 22). For simplicity, however, in the drawings for explaining the fabrication procedure, the sectional diagrams show only a region corresponding to one of the semiconductor device 10.

Figure 3:
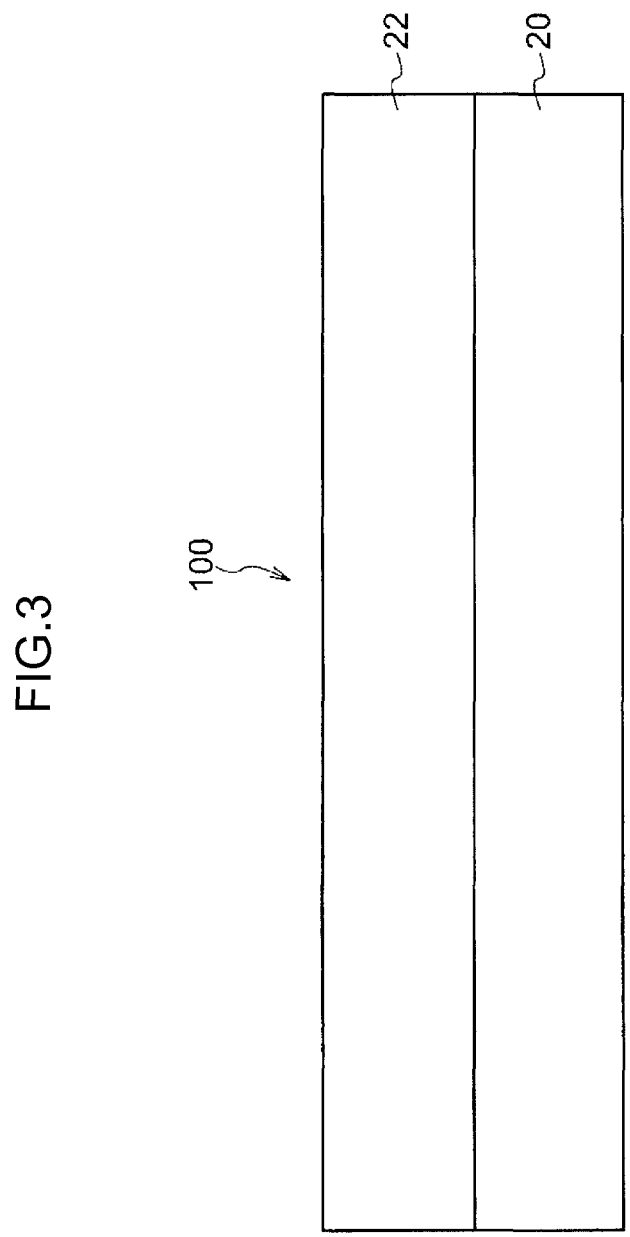
FIG. 3 is a sectional diagram of the semiconductor device for describing a wafer preparation step in the semiconductor device fabrication method in accordance with the present exemplary embodiment.

First in the fabrication of the semiconductor device 10, as shown in FIG. 3, the wafer 100 is prepared by the N⁻ epitaxial layer 22 being formed on the N⁺ semiconductor substrate 20. FIG. 3 is a sectional diagram of the semiconductor device 10 for describing the wafer preparation process. The wafer 100 is obtained by, for example, doping a silicon wafer with arsenic or phosphorus to form the N⁺ semiconductor substrate 20, and then causing epitaxial growth to form the N⁻ epitaxial layer 22 in an environment in which a gas containing silicon, such as silane ($SiH_4$) or the like, is doped with phosphine ($PH_3$), arsine ($AsH_3$) or the like.

Figure 4:
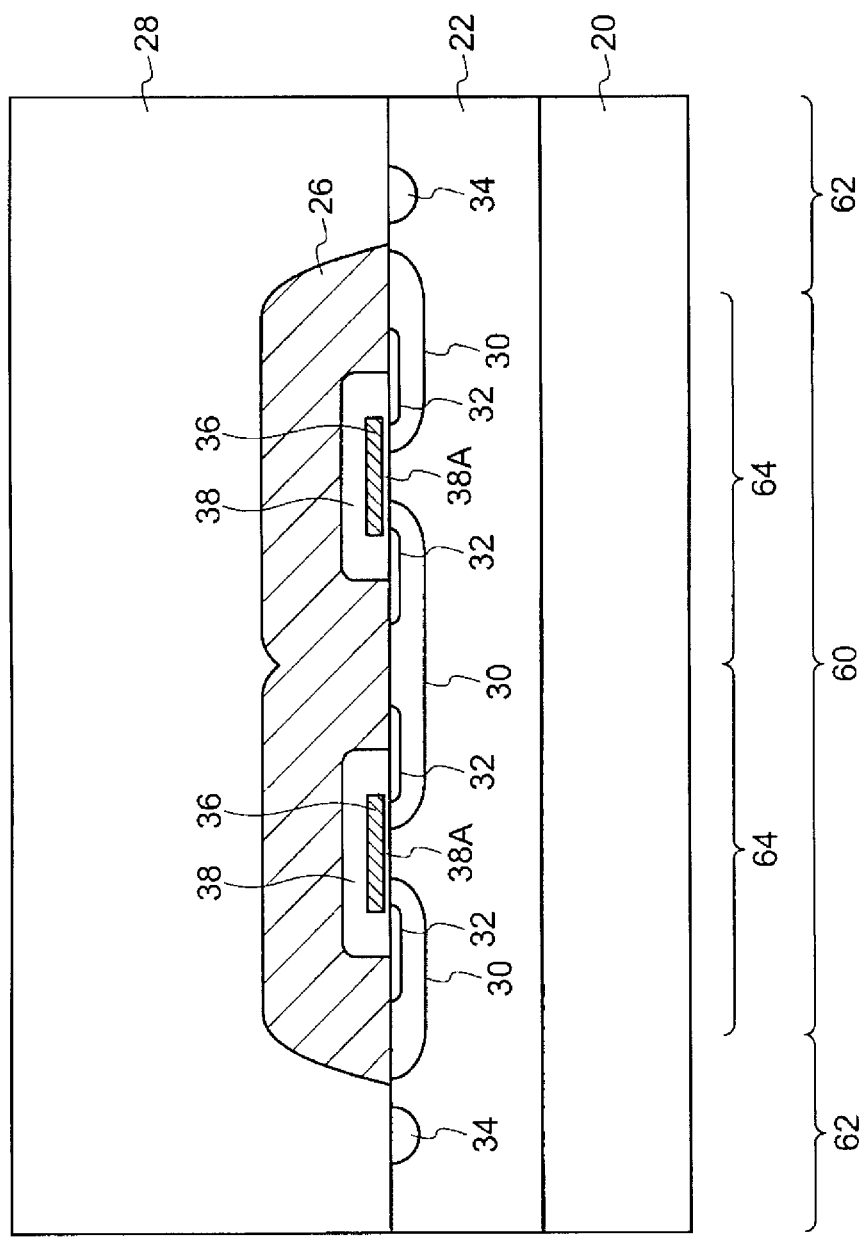
FIG. 4 is a sectional diagram of the semiconductor device for describing a semiconductor component formation step in the semiconductor device fabrication method in accordance with the present exemplary embodiment.

Now details of the process of formation of the semiconductor components in the first step (step S100) are described with reference to FIG. 4. FIG. 4 is a sectional diagram of the semiconductor device 10 for describing the process of forming the semiconductor components.

In the first step, the semiconductor components, the guard rings 34 and the protective film 28 are formed on the N⁻ epitaxial layer 22.

The following method can be mentioned as an example of a method of fabricating the semiconductor components. Note that the method of fabricating the semiconductor components is not limited to the following method; it is sufficient to use a method that accords with required characteristics and the like.

The P layer 30, which is to be the P⁺ type contact region, is formed by masking a predetermined region of the surface of the N⁻ epitaxial layer 22 with a resist mask and performing ion implantation in order to implant boron (B) or the like. In the present exemplary embodiment, the guard rings 34 are formed in the guard ring region 62 at this time; the guard rings 34 form the same kind of PN junction as the P layer 30. In the present exemplary embodiment, the guard rings 34 are formed so as to enclose the component regions 60, and the region in which the guard rings 34 are formed serves as the guard ring region 62 (see FIG. 7A and FIG. 7C; described in detail below). The guard rings 34 assure withstand voltages of the component regions 60.

Then, masking is implemented with a photoresist film and the N⁺ layer 32, which is to be the N⁺-type source regions, is formed, after which the photoresist film is removed. A photoresist film is formed to correspond with positions at which gate electrodes (the polysilicon 36) are to be formed, and a gate oxide layer 38A is formed by thermal oxidation. An undoped polysilicon layer is formed by chemical vapor deposition (CVD), and the polysilicon 36 that is to function as gate electrodes is formed by patterning of the polysilicon layer. A silicon insulation layer is formed by CVD, after which a predetermined region that is to be a contact region with the P layer 30 or the like is etched with a photoresist. Thus, the interlayer insulation film 38 is formed.

Then, regions other than the component regions 60 are masked with a photoresist film, and the surface electrode metal 26 that is to function as source electrodes is formed by sputtering so as to cover the whole of the component regions 60.

The protective film 28 is formed of a film of an oxide of silicon or the like over the whole area of the N⁻ epitaxial layer 22. Thus, the semiconductor components are fabricated.

Figure 5:
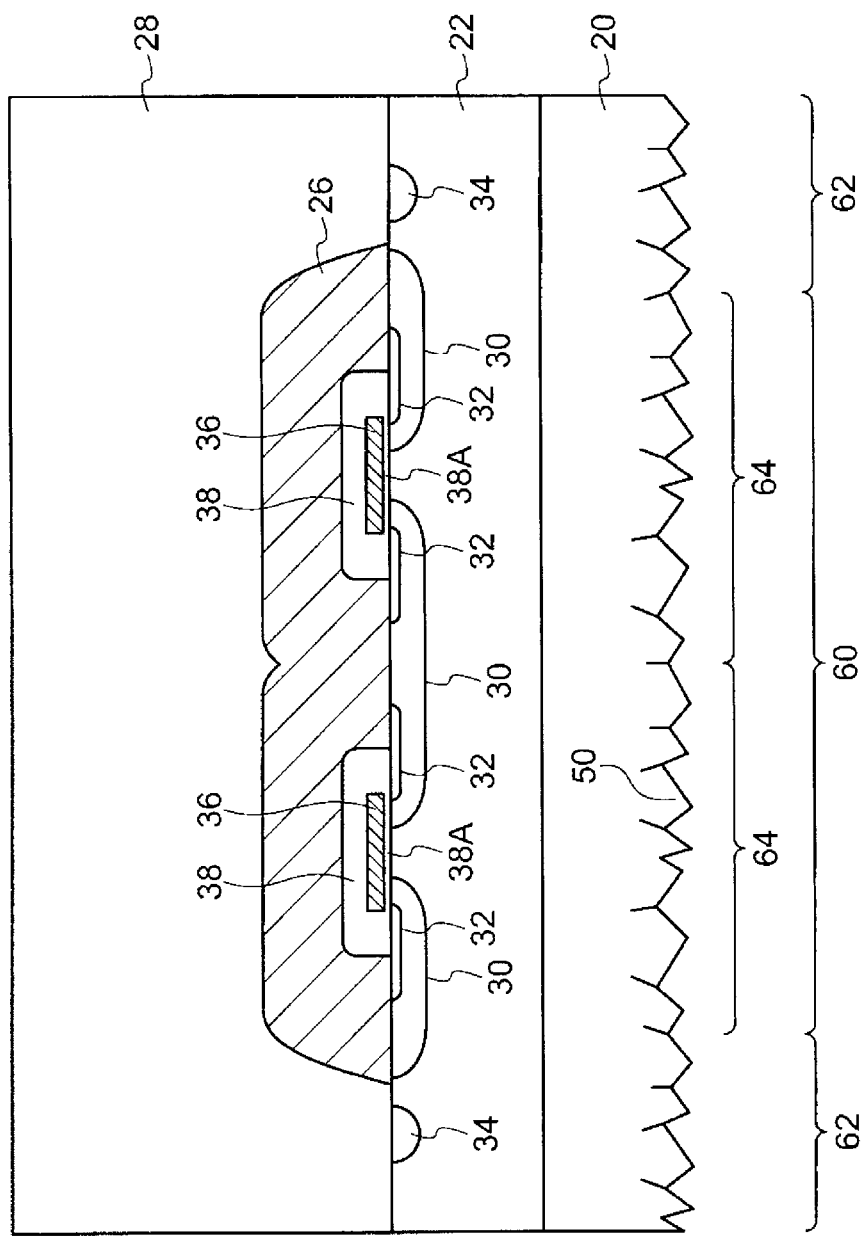
FIG. 5 is a sectional diagram of the semiconductor device for describing a grinding step in the semiconductor device fabrication method in accordance with the present exemplary embodiment.

The process of grinding in the backgrinding of the second step (step S102) is now described in detail with reference to FIG. 5. FIG. 5 is a sectional diagram of the semiconductor device 10 for describing the grinding step.

In the second step, the rear surface of the wafer 100 (the N⁺ semiconductor substrate 20) is ground by the backgrinding, and the wafer 100 is set to a required thickness. A method of the backgrinding is not particularly limited but, as a concrete example, a method of grinding using a #325 grindstone (a backgrinding wheel) can be mentioned. The characteristics of the semiconductor device 10 (for example, on-resistance) are improved by this provision of the fracture surface 50. Therefore, a level of unevenness of the fracture surface 50 may be specified in accordance with the required characteristics of the semiconductor device 10 and the like, and the grinding method may be specified in accordance with this unevenness.

The fracture surface 50 is formed at the rear surface of the $N^+$ semiconductor substrate 20 by the backgrinding. In the second step, the fracture surface 50 is formed over the whole area of the wafer 100.

Figure 6:
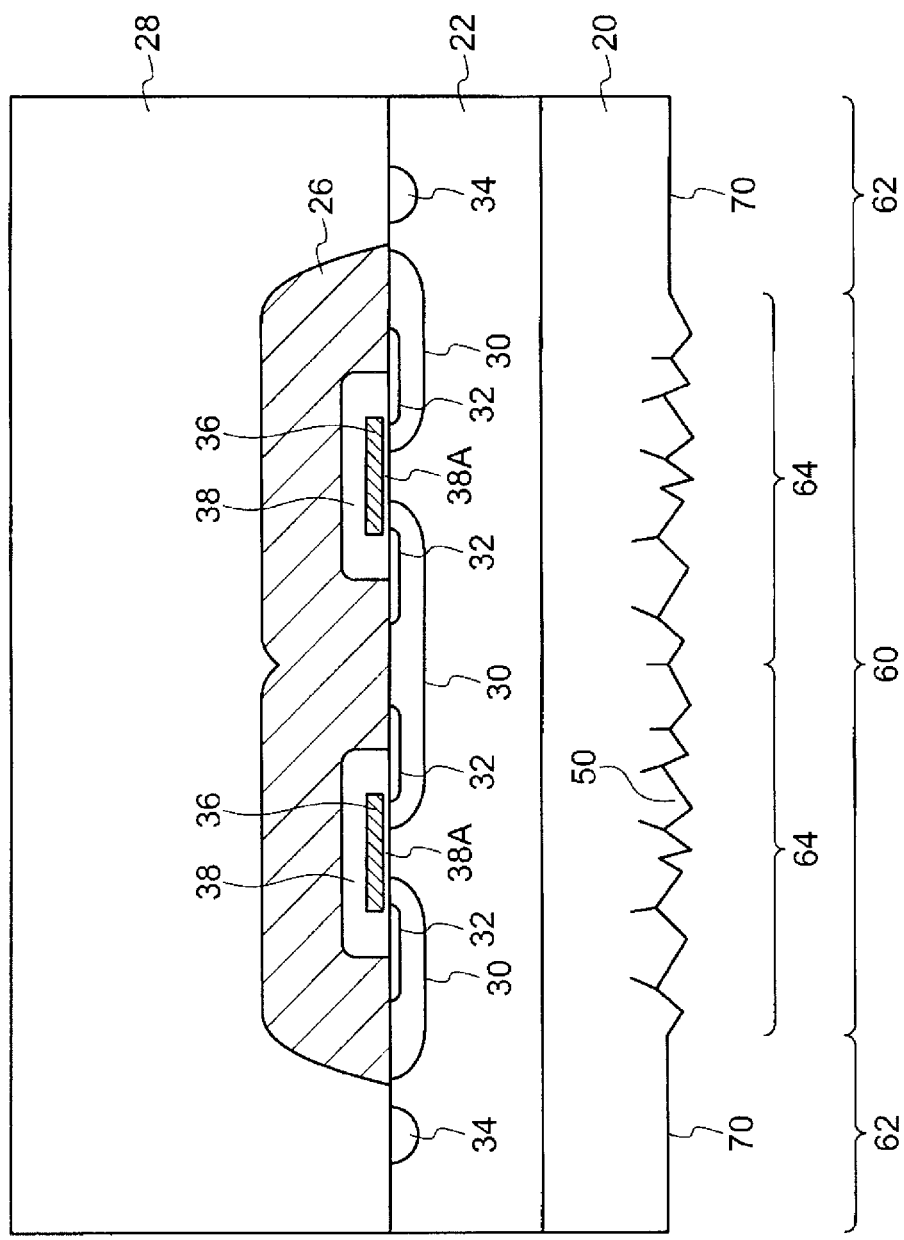
FIG. 6 is a sectional diagram of the semiconductor device for describing a laser annealing step in the semiconductor device fabrication method in accordance with the present exemplary embodiment.
Figure 7:
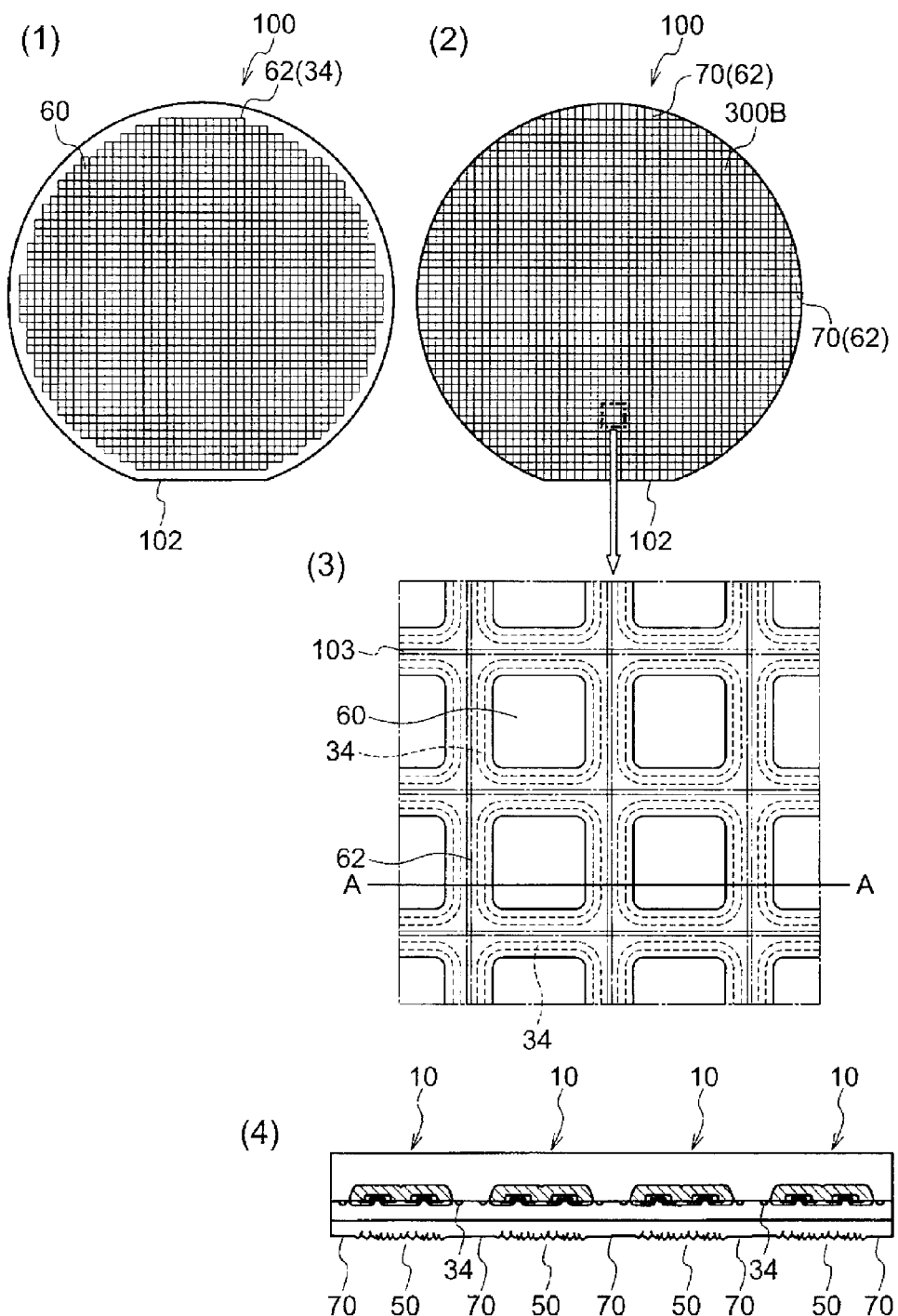
FIG. 7 is a descriptive diagram for describing the relationship between a guard ring region (guard rings) of the semiconductor device in accordance with the present exemplary embodiment and a laser annealing region.
Figure 8:
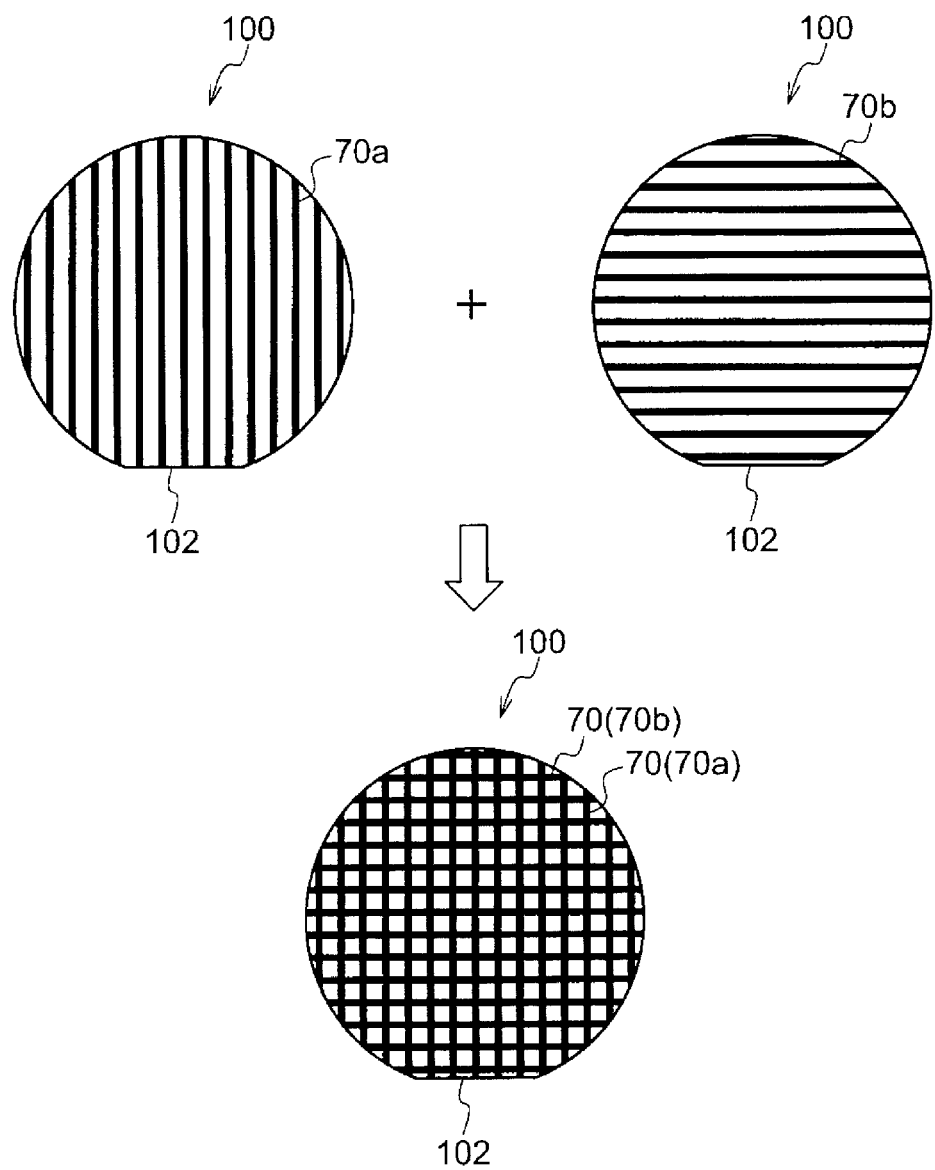
FIG. 8 is a descriptive diagram for describing the laser annealing region formed by the semiconductor device fabrication method in accordance with the present exemplary embodiment.

The laser annealing process of the third step (step S104) is now described in detail with reference to FIG. 6 to FIG. 9. FIG. 6 is a sectional diagram of the semiconductor device 10 for describing the laser annealing process. FIG. 7 is a descriptive diagram for describing the relationship between the guard ring region 62 (the guard rings 34) and the laser annealing region 70. FIG. 7(1) shows the whole of the wafer 100, and shows the guard ring region 62 that is formed over the whole of the wafer 100. FIG. 7(2) shows the whole of the wafer 100, and shows the laser annealing region 70 that is formed over the whole of the wafer 100. FIG. 7(3) is a magnification of a portion of FIG. 7(2). FIG. 7(4) is a sectional diagram taken along line A-A of FIG. 7(3). FIG. 8 is a descriptive diagram for describing the laser annealing region.

In the third step, laser annealing is applied to the rear surface of the $N^+$ semiconductor substrate 20 in correspondence with the guard ring region 62 to form the laser annealing region 70.

The guard ring region 62 formed in the first step described above is formed as illustrated in FIG. 7(1) and FIG. 7(3). In the present exemplary embodiment, the guard rings 34 are provided so as to enclose the component regions 60 of the respective semiconductor devices 10. The region in which the guard rings 34 are provided is the guard ring region 62. Specifically, the guard ring region 62 is provided in a lattice pattern formed by straight lines that are substantially perpendicular and substantially parallel with respect to the direction of an orientation flat 102 of the wafer 100. In the present exemplary embodiment, as illustrated in FIG. 7(1), the guard ring region 62 is not provided in regions at edge portions of the wafer 100 in which the semiconductor devices 10 are not formed.

In the third step, a laser annealer is used to apply the laser annealing treatment to the fracture surface 50 at the rear surface of the $N^+$ semiconductor substrate 20 in correspondence with the guard ring region 62. In the present exemplary embodiment, as illustrated in FIG. 7(2), the laser annealing may be applied to regions at the edge portions of the wafer 100 at which the guard ring region 62 is not formed.

Specifically, as shown in FIG. 8, the laser annealing is applied to positions corresponding with the guard ring region 62 in directions that are substantially perpendicular with respect to the orientation flat 102 to form a laser annealing region 70a, and the laser annealing is applied to positions corresponding with the guard ring region 62 in directions that are substantially parallel with the direction of the orientation flat 102 to form a laser annealing region 70b. That is, the lattice-pattern laser annealing region 70 is formed by the laser annealing region 70a substantially in the perpendicular direction and the laser annealing region 70b substantially in the parallel direction with respect to the direction of the orientation flat 102.

At portions irradiated by the laser, the fracture surface 50 reaches a high temperature and the silicon of the $N^+$ semiconductor substrate 20 melts and smoothes. As a result, the fracture surface 50 disappears. A duration of the laser annealing may be specified in accordance with the level of unevenness of the fracture surface 50, a level of smoothness and the like.

Figure 9:
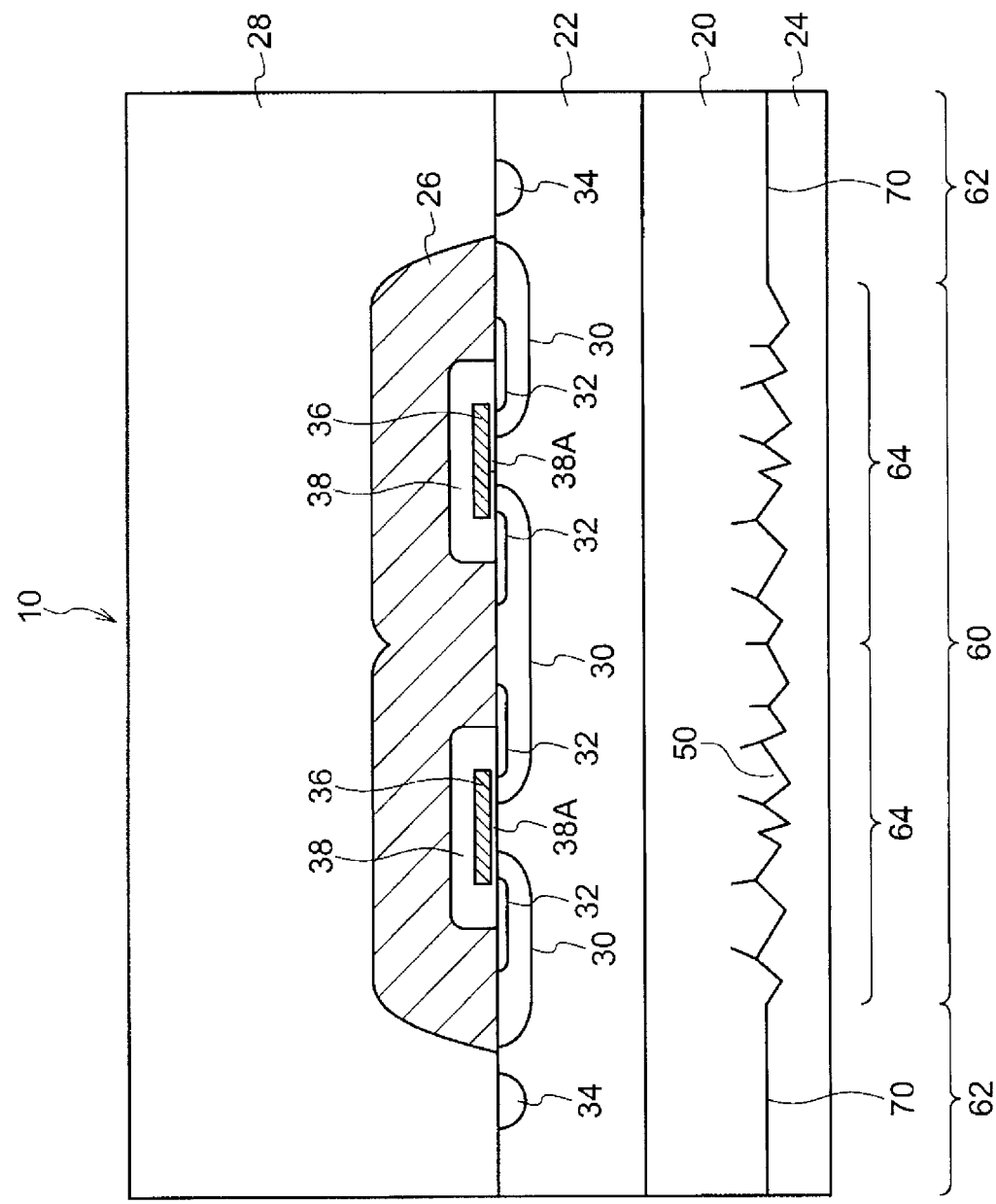
FIG. 9 is a sectional diagram of the semiconductor device for describing a rear surface electrode formation step in the semiconductor device fabrication method in accordance with the present exemplary embodiment.

The process of formation of the rear surface electrode in the fourth step (step S106) is now described in detail with reference to FIG. 9. FIG. 9 is a sectional diagram of the semiconductor device 10 for describing the process of forming the rear surface electrode.

In the fourth step, the back metal electrode 24 that is to function as drain electrodes is formed over the whole area of the wafer 100 (the $N^+$ semiconductor substrate 20) by sputtering, vapor deposition or the like.

The dicing process of the fifth step (step S108) is now described in detail. In the fifth step, grooves are formed in the wafer 100 by a grindstone to be scribing lines 103 (see FIG. 7(3)), and the wafer 100 is cleaved along these scribing lines to singulate the plural semiconductor devices 10.

Thus, the semiconductor device 10 according to the present exemplary embodiment is formed by the first to fifth steps described above.

Now, operation of the semiconductor device 10 according to the present invention is described. As shown in FIG. 1, the semiconductor device 10 of the present exemplary embodiment is provided with the fracture surface 50 and the laser annealing region 70 at the rear surface of the wafer 100 (the $N^+$ semiconductor substrate 20). The fracture surface 50 is provided at the component regions 60, and the laser annealing region 70 is provided at the guard ring region 62.

The contact area of this semiconductor device 10 is increased by the fracture surface 50 acting as the contract area between the $N^+$ semiconductor substrate 20 and the back metal electrode 24. As a result, on-resistance and $V_F$ (a voltage drop associated with forward voltages) are reduced.

Figure 11:
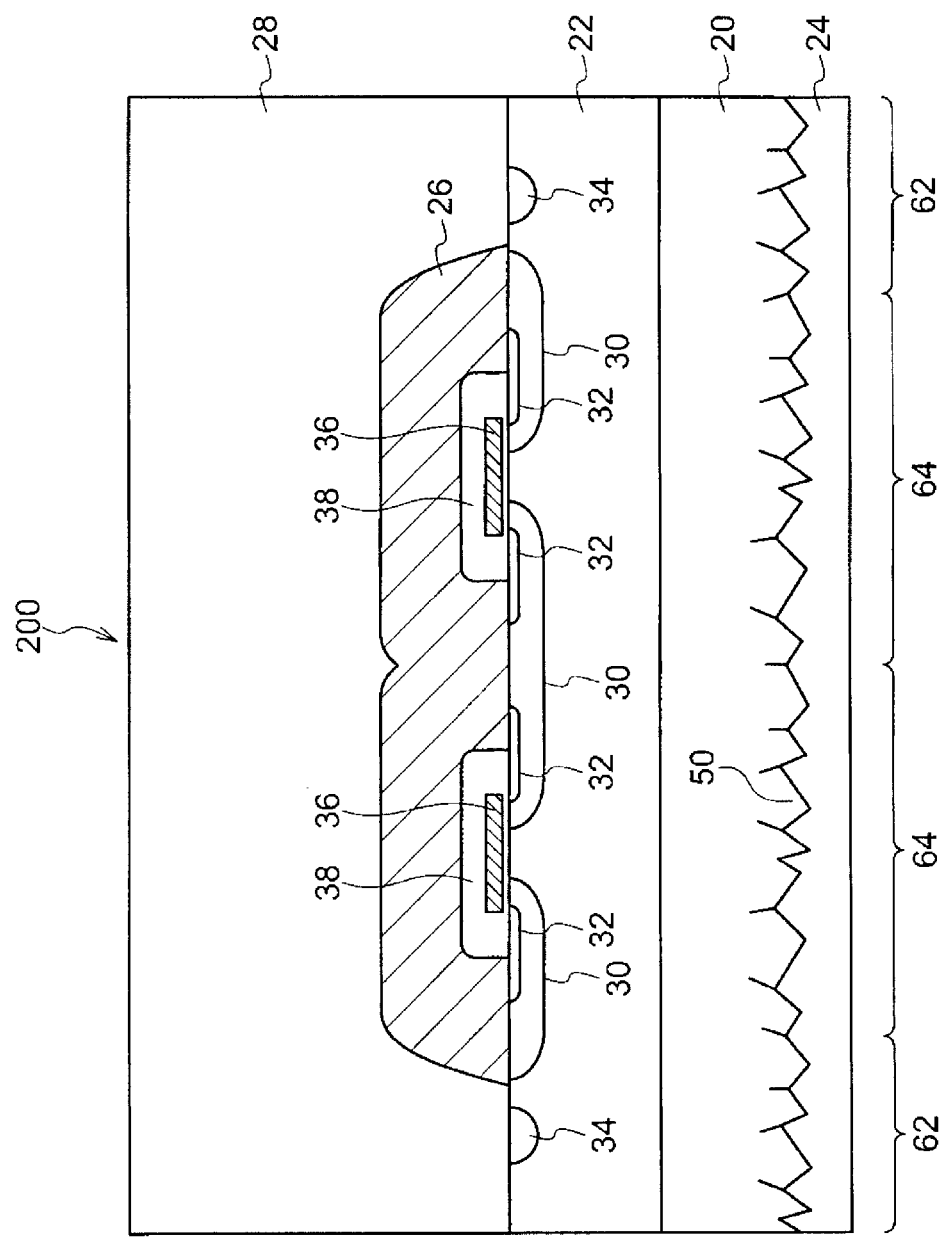
FIG. 11 is a sectional diagram showing the general structure of an example of a semiconductor device at which the laser annealing region is not formed, which is a comparative example.

Therefore, the on-resistance and $V_F$ are reduced compared to a case in which the whole contact area between the $N^+$ semiconductor substrate 20 and the back metal electrode 24 is formed as the fracture surface 50, as in a semiconductor device 200 that is shown in FIG. 11 as a comparative example. For the comparative example semiconductor device 200 shown in FIG. 11, the third step of the present exemplary embodiment described above is not carried out, so laser annealing is not applied to the fracture surface 50 in correspondence with the guard ring region 62.

Figure 12:
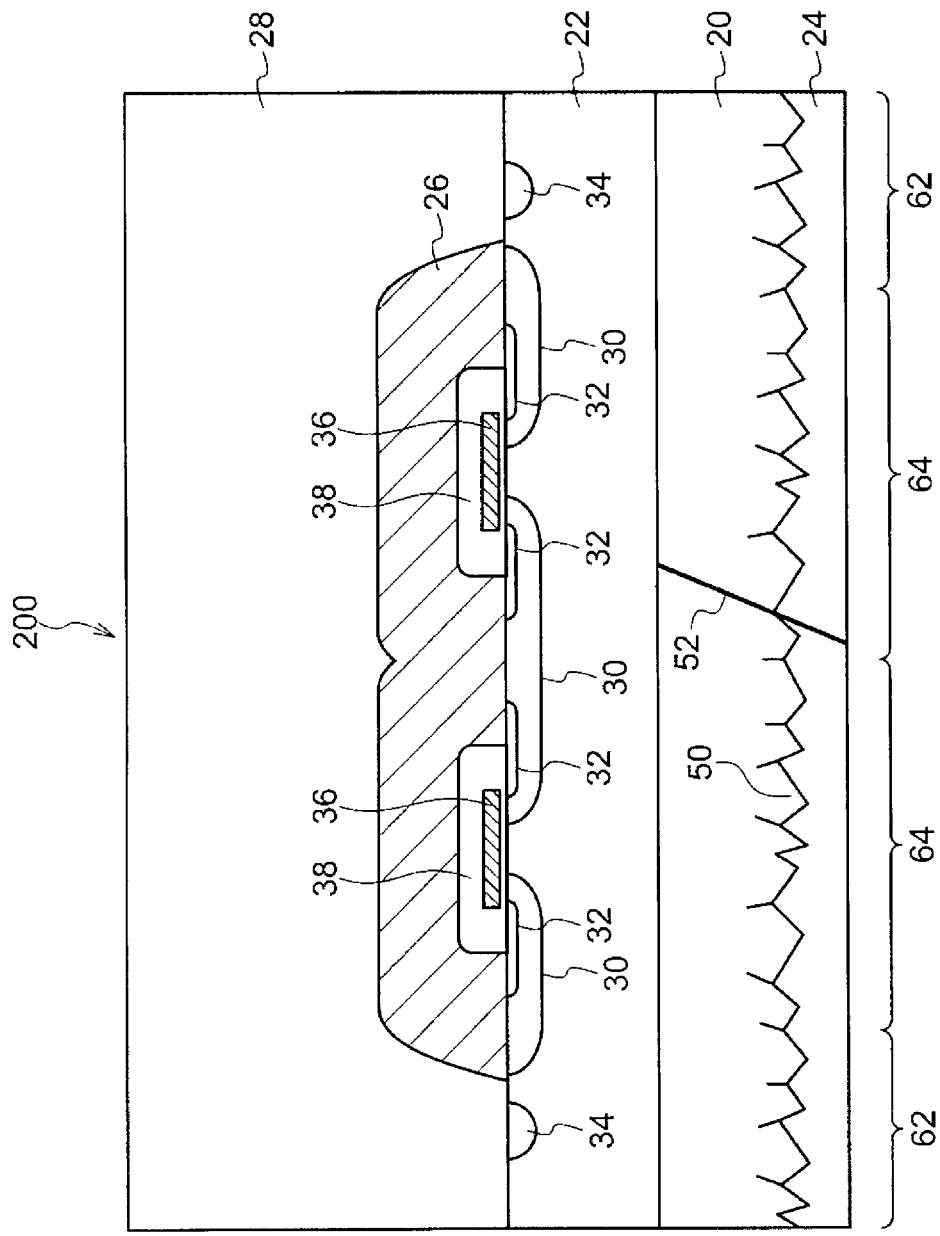
FIG. 12 is a sectional diagram for describing the formation of a chip crack in the semiconductor device of the comparative example.

When backgrinding is applied, in general, micro-cracks form in the fracture surface 50. The formation of these micro-cracks adversely affects the transverse strength of the semiconductor device 10 (the wafer 100) due to unevenness, and there is a concern that a chip crack 52 may occur, as in the comparative example semiconductor device 200 illustrated in FIG. 12. The wafer 100 is particularly susceptible to breaking in the crystal axis direction (crystal plane orientation) of the silicon shown by the orientation flat 102.

In contrast, in the semiconductor device 10 according to the present exemplary embodiment, the laser annealing region 70 in which laser annealing has been applied to the fracture surface 50 corresponding with the guard ring region 62 is provided. The fracture surface 50 is absent from the laser annealing region 70, and the laser annealing region 70 is smoothed. Therefore, the concern described above is removed and the transverse strength is improved.

In the present exemplary embodiment, because the laser annealing region 70 at which the fracture surface 50 is smoothed is provided at the contact surface between the rear surface of the $N^+$ semiconductor substrate 20 and the back metal electrode 24, the on-resistance, $V_F$ and the like are reduced by the fracture surface 50 while the transverse strength is improved by the laser annealing region 70.

If the laser annealing region 70 is made larger, the area of the fracture surface 50 decreases and consequently, while the transverse strength is improved, amounts by which the on-resistance, $V_F$ and the like are reduced are smaller. Thus, in the semiconductor device 10, there is a trade-off between the improvement in the transverse strength and the reductions in on-resistance, $V_F$ and the like. Therefore, the size and degree of smoothing of the laser annealing region 70 may be specified in accordance with a required transverse strength and tolerance ranges of on-resistance, $V_F$ and the like.

Figure 10:
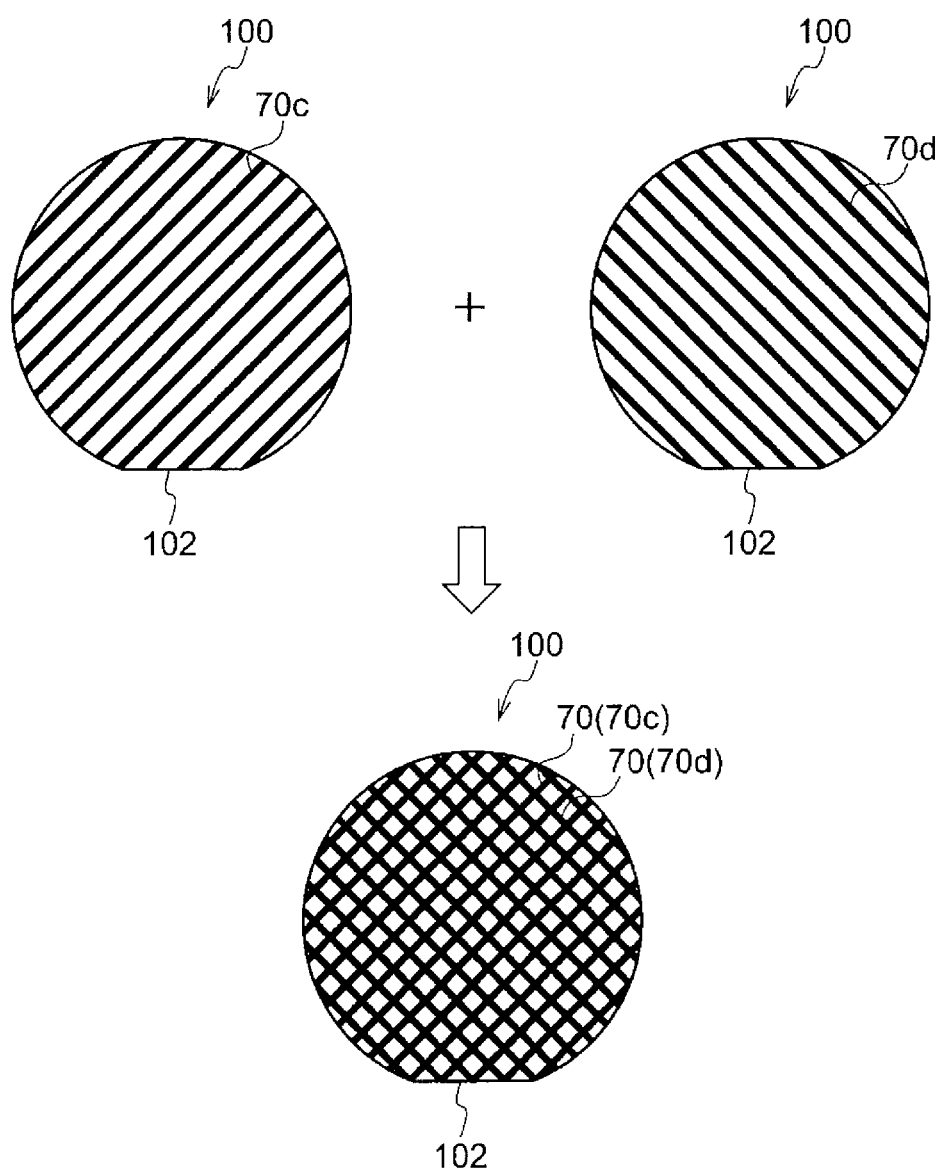
FIG. 10 is a descriptive diagram for describing another example of the laser annealing region formed by the semiconductor device fabrication method in accordance with the present exemplary embodiment.

In the present exemplary embodiment, the laser annealing is applied to the fracture surface 50 in correspondence with the guard ring region 62 to form the laser annealing region 70 in a lattice pattern, but this is not a limitation; the laser annealing region 70 may be formed in other positions and patterns. For example, as illustrated in FIG. 10, the laser annealing may be applied so as to form the laser annealing region 70 (laser annealing regions 70c and 70d) diagonally with respect to the orientation flat 102. As mentioned above, the semiconductor device 10 (the wafer 100) is susceptible to breakage in the direction of the crystal axis. Therefore, the transverse strength may be improved further by providing the laser annealing region 70 in a diagonal striped pattern at angles of 45° with respect to the crystal axis direction. Further, when there is a direction other than the crystal axis direction that is susceptible to breakage, the laser annealing region 70 may be provided in a stripe pattern that is angled so as to form an angle of 45° with respect to that direction. Of course, "45°" is not intended to mean precisely 45° but may be an angle within a tolerance range that contains 45°. The transverse strength may be improved by only providing either the laser annealing region 70c or the laser annealing region 70d shown in FIG. 10. However, the transverse strength may be improved more by combining the two to form the laser annealing region 70 in a diamond pattern. When the laser annealing region 70 is formed in a diamond pattern, the crystal axis direction need not be considered.

In the present exemplary embodiment, a case in which the semiconductor component is the vertical MOSFET 64 is described. However, the semiconductor component provided at the semiconductor device 10 is not limited thus; it is sufficient that it be a semiconductor component for which the back metal electrode 24 is provided at the rear surface of the wafer 100. For example, the semiconductor component may be an insulated gate bipolar transistor (IGBT). In the case of an IGBT, for the same reasons as described above, $V_{CEsat}$ (the collector-emitter saturation voltage) may be reduced and the transverse strength improved. The semiconductor component may instead be a diode, in which case, for the same reasons as described above, $V_F$ may be reduced and the transverse strength improved.

In other respects, structures, fabrication processes and the like of the semiconductor device 10 described in the above exemplary embodiment are examples and it will it clear that these may be modified in accordance with circumstances within a scope not departing from the spirit of the present invention.

What is claimed is:

1. A method of fabricating a semiconductor device, the method comprising:
    forming a semiconductor component portion at a first surface of a substrate;
    applying a grinding treatment to a second surface of the substrate that is opposite from the first surface to form a fracture surface;
    applying a fracture surface removal treatment to predetermined positions of the fracture surface of the second surface; and
    forming an electrode at the second surface,
    wherein the applying of the fracture surface removal treatment includes applying the fracture surface removal treatment to a region of the second surface that is opposite from a region of the first surface in which the semiconductor component portion is not formed.

2. A method of fabricating a semiconductor device, the method comprising:
    forming a semiconductor component portion at a first surface of a substrate;
    applying a grinding treatment to a second surface of the substrate that is opposite from the first surface to form a fracture surface;
    applying a fracture surface removal treatment to predetermined positions of the fracture surface of the second surface; and
    forming an electrode at the second surface,
    wherein the applying of the fracture surface removal treatment includes applying the fracture surface removal treatment in a stripe pattern, an angle of which with respect to a crystal axis direction of the substrate is within a predetermined range that includes 45°.

3. A method of fabricating a semiconductor device, the method comprising:
    forming a semiconductor component portion at a first surface of a substrate;
    applying a grinding treatment to a second surface of the substrate that is opposite from the first surface to form a fracture surface;
    applying a fracture surface removal treatment to predetermined positions of the fracture surface of the second surface;
    forming an electrode at the second surface; and
    after the forming of the semiconductor component portion, forming a guard ring at the first surface, the guard ring encircling the semiconductor component portion,
    wherein the applying of the fracture surface removal treatment includes applying the fracture surface removal treatment to a region of the second surface that is opposite from a region of the first surface in which the guard ring is formed.

4. A method of fabricating a semiconductor device, the method comprising:
    forming a semiconductor component portion at a first surface of a substrate;
    applying a grinding treatment to a second surface of the substrate that is opposite from the first surface to form a fracture surface;
    applying a fracture surface removal treatment to predetermined positions of the fracture surface of the second surface;
    forming an electrode at the second surface,
    wherein the forming of the semiconductor component portion includes forming a plurality of the semiconductor component portions; and
    before the forming of the electrode at the second surface, dicing the substrate and singulating the plurality of semiconductor component portions.

5. A semiconductor device comprising:
    a substrate having a first surface and a second surface, the second surface being opposite from the first surface and having a fracture surface formed by a grinding treatment, predetermined positions of the fracture surface having been subjected to a grinding surface removal treatment;
a semiconductor component portion formed at the first surface; and
an electrode formed at the second surface,
wherein the predetermined portions of the fracture surface include a region of the second surface that is opposite from a region of the first surface at which the semiconductor component portion is not formed.

6. A semiconductor device comprising:
a substrate having a first surface and a second surface, the second surface being opposite from the first surface and having a fracture surface formed by a grinding treatment, predetermined positions of the fracture surface having been subjected to a grinding surface removal treatment;
a semiconductor component portion formed at the first surface;
an electrode formed at the second surface; and
a guard ring formed at the first surface, the guard ring configured to encircle the semiconductor component portion,
wherein the predetermined portions of the fracture surface include a region of the second surface that is opposite from a region of the first surface at which the guard ring is formed.

\* \* \* \* \*